United States Patent
Hashimura et al.

(10) Patent No.: US 9,348,068 B2
(45) Date of Patent: May 24, 2016

(54) ENERGY GENERATING TRANSPARENT FILM

(71) Applicant: Sharp Laboratories of America, Inc., Camas, WA (US)

(72) Inventors: Akinori Hashimura, Vancouver, WA (US); Douglas Tweet, Camas, WA (US); Gary Hinch, Vancouver, WA (US); Byron Cocilovo, Tucson, AZ (US)

(73) Assignee: Sharp Laboratories of America, Inc., Camas, WA (US)

( * ) Notice: Subject to any disclaimer, the term of this patent is extended or adjusted under 35 U.S.C. 154(b) by 262 days.

(21) Appl. No.: 13/955,063

(22) Filed: Jul. 31, 2013

(65) Prior Publication Data

US 2013/0333693 A1    Dec. 19, 2013

Related U.S. Application Data

(63) Continuation-in-part of application No. 13/872,473, filed on Apr. 29, 2013, now Pat. No. 9,091,812, which is a continuation-in-part of application No. 13/714,073, filed on Dec. 13, 2012, now Pat. No.

(Continued)

(51) Int. Cl.
*G02F 1/03*      (2006.01)
*G02B 5/20*      (2006.01)
(Continued)

(52) U.S. Cl.
CPC .............. *G02B 5/208* (2013.01); *F24J 2/0015* (2013.01); *H01L 31/0543* (2014.12); *H01L 31/0547* (2014.12); *H01L 31/0549* (2014.12); *B82Y 20/00* (2013.01); *B82Y 30/00* (2013.01);
(Continued)

(58) Field of Classification Search
CPC ...................................... G02F 1/157

USPC ......................................................... 359/245
See application file for complete search history.

(56) References Cited

U.S. PATENT DOCUMENTS 6,008,449 A    12/1999   Cole
2009/0255568 A1   10/2009   Morgan
(Continued)

FOREIGN PATENT DOCUMENTS

JP      2011-094471      5/2011

OTHER PUBLICATIONS

Building-Integrated Photovoltaics (BIPV) Market—Global Industry Size, Market Share, Trends, Analysis and Forecasts 2012-2018, Transparency Market Research.

*Primary Examiner* — James Jones
(74) *Attorney, Agent, or Firm* — Law Office of Gerald Maliszewski; Gerald Maliszewski (57) ABSTRACT

An energy-generating transparent (EGT) structure is provided, in addition to a method for generating energy from light incident to an EGT structure. The EGT structure is made up of a window pane with an interior surface adjacent a reflective structure. The method accepts light incident to an exterior surface of the window pane, and transmits light in the visible spectrum through the window pane and reflective structure. However, light in the near-infrared (NIR) spectrum is reflected back from the reflective structure into the window pane, so that reflected NIR, spectrum light is supplied to an edge of the window pane. For example, reflected NIR spectrum light is supplied to the window pane edge if the light has an angle greater than or equal to an angle TIR occurring between the window pane exterior surface and air. This reflected NIR spectrum light can be converted to electrical or thermal energy.

10 Claims, 10 Drawing Sheets

Related U.S. Application Data 9,063,353, which is a continuation-in-part of application No. 13/558,396, filed on Jul. 26, 2012, now Pat. No. 8,767,282, which is a continuation-in-part of application No. 13/449,370, filed on Apr. 18, 2012, now Pat. No. 8,896,907, which is a continuation-in-part of application No. 13/434,548, filed on Mar. 29, 2012, now Pat. No. 8,810,897, which is a continuation-in-part of application No. 12/836,121, filed on Jul. 14, 2010, now Pat. No. 8,368,998, which is a continuation-in-part of application No. 12/646,585, filed on Dec. 23, 2009, now Pat. No. 8,223,425, which is a continuation-in-part of application No. 12/635,349, filed on Dec. 10, 2009, now Pat. No. 8,355,099, which is a continuation-in-part of application No. 12/621,567, filed on Nov. 19, 2009, now Pat. No. 8,339,543, which is a continuation-in-part of application No. 12/614,368, filed on Nov. 6, 2009, now Pat. No. 8,045,107.

(51) Int. Cl.
*F24J 2/00* (2014.01)
*H01L 31/054* (2014.01)
*B82Y 20/00* (2011.01)
*B82Y 30/00* (2011.01)

(52) U.S. Cl.
CPC .................. *Y02B 10/20* (2013.01); *Y02E 10/52* (2013.01); *Y10S 977/834* (2013.01)

(56) References Cited

U.S. PATENT DOCUMENTS

2013/0044498 A1* 2/2013 Saccomanno ............. F21V 3/04
362/317
2013/0240037 A1 9/2013 Yui

* cited by examiner

Fig. 9B
INCIDENT LIGHT
(SMALL ANGLE OF INCIDENCE)

ENERGY GENERATING TRANSPARENT FILM

RELATED APPLICATION

The application is a Continuation-in-Part of an application entitled, ENERGY-EFFICIENT TRANSPARENT SOLAR FILM, invented by Aki Hashimura et al., Ser. No. 13/872,473, filed on Apr. 29, 2013;

which is a Continuation-in-Part of an application entitled, AIR STABLE, COLOR TUNABLE PLASMONIC STRUCTURES FOR ULTRAVIOLET (UV) AND VISIBLE WAVELENGTH APPLICATIONS, invented by Aki Hashimura et al., Ser. No. 13/714,073, filed on Dec. 13, 2012;

which is a Continuation-in-Part of an application entitled, PLASMONIC IN-CELL POLARIZER, invented by Aki Hashimura et al., Ser. No. 13/558,396, filed on Jul. 26, 2012;

which is a Continuation-in-Part of an application entitled, PLASMONIC REFLECTIVE DISPLAY FABRICATED USING ANODIZED ALUMINUM OXIDE, invented by Aki Hashimura et al., Ser. No. 13/449,370, filed on Apr. 19, 2012;

which is a Continuation-in-Part of an application entitled, METHOD FOR IMPROVING METALLIC NANOSTRUCTURE STABILITY, invented by Aki Hashimura et al., Ser. No. 13/434,548, filed on Mar. 29, 2012;

which is a Continuation-in-Part of an application entitled, PLASMONIC ELECTRONIC SKIN, invented by Tang et al., Ser. No. 12/836,121, filed on Jul. 14, 2012, now U.S. Pat. No. 8,368,998;

which is a Continuation-in-Part of an application entitled, PLASMONIC DEVICE TUNED USING PHYSICAL MODULATION, invented by Tang et al., Ser. No. 12/646,585, filed on Dec. 23, 2009, now U.S. Pat. No. 8,223,425;

which is a Continuation-in-Part of an application entitled, PLASMONIC DEVICE TUNED USING LIQUID CRYSTAL MOLECULE DIPOLE CONTROL, invented by Tang et al., Ser. No. 12/635,349, filed on Dec. 10, 2009, now U.S. Pat. No. 8,355,099;

which is a Continuation-in-Part of an application entitled, PLASMONIC DEVICE TUNED USING ELASTIC AND REFRACTIVE MODULATION MECHANISMS, invented by Tang et al., Ser. No. 12/621,567, filed on Nov. 19, 2009, now U.S. Pat. No. 8,339,543;

which is a Continuation-in-Part of an application entitled, COLOR-TUNABLE PLASMONIC DEVICE WITH A PARTIALLY MODULATED REFRACTIVE INDEX, invented by Tang et al., Ser. No. 12/614,368, filed on Nov. 6, 2009, now U.S. Pat. No. 8,045,107. All the above-referenced applications are incorporated herein by reference.

BACKGROUND OF THE INVENTION

1. Field of the Invention

This invention generally relates to an energy efficient transparent structure and, more particularly, to a solar film layer(s) capable of selectively transmitting light based upon the criteria of wavelength or angle of incidence, while selectively reflecting light for the purpose of generating energy.

2. Description of the Related Art

The windows of commercial and residential buildings represent a substantial opportunity for energy generation, but window transparency is critical. Therefore, an approach is needed to capture solar radiation at low cost, without compromising the window's transparency. Due to the large surface area of building windows, windows can be used to capture solar energy. This idea is attractive if transparency is maintained and the additional cost is low. As part of the new opportunity presented from building integrated photovoltaics (BIPV), building windows can be used to generate clean alternative energy.

The emerging market for BIPV offers a new opportunity to develop revenue streams for both building and solar industries that have been under stress in recent years. The advantage of integrated photovoltaics over conventional non-integrated systems is that the initial cost can be offset by reducing what is spent on building materials and labor that would normally be used to construct the part of the building being replaced by the BIPV modules, such as roof, skylights, facades, or windows. According to a recent market report, the global market for BIPV is expected to reach the capacity of 11,392 megawatts by the year 2015 at the compounded annual growth rate of 56%. The growing demand for energy-efficient, flexible, and transparent solar materials is transforming the way architects and manufacturers use photovoltaic systems.

Concurrent with the BIPV opportunity is smart window technology that may possibly replace existing building windows. According to the U.S. Dept. of Energy, homes and commercial buildings consume approximately 40% of the electricity used in the United States, costing consumers approximately US$200 billion annually. One solution to reducing the energy consumption of personal and commercial buildings is smart window technology, which reduces the amount of solar heat entering the building by altering the transparency of the windows to reject part of visible and near-infrared (NIR) light. The investment in smart window installation is offset by the energy savings realized from reducing the cost of heating, ventilation, air conditioning (HVAC) systems. However, currently all of the smart window technologies require an electrical power source to activate the tinting features of the windows. By applying source voltages, the light transmittance, transparency, or shading of windows can dynamically change. This feature adds a significant amount to the installation cost of smart windows, as electrical wires need to be connected from all the windows to a main controller.

It would be advantageous if a smart window could be self-powered with solar energy and controlled without any electrical wiring, reducing the overall labor cost and installed system price of the smart window.

SUMMARY OF THE INVENTION

Described herein is a self-powered smart window enabled as an energy-generating transparent (EGT) structure. The EGT structure is a non-invasive, low-cost solution to powering many electrical devices that can not only be applied to smart windows, but also to low power consumer devices such as global positioning satellite (GPS) devices, smart phones, and e-tablets. Since the EGT structure has a high visible light transmission, it can be integrated into buildings and devices without adversely affecting the visual appearance. The EGT structure comprises of light-capturing and reflective mechanisms inside visibly transmissive materials.

In one aspect, the EGT structure comprises a reflective structure with multiple cone surfaces formed between transparent film layers, positioned under a glass substrate. A first set of cone surfaces formed in a first transparent film have a first angle to define the direction of reflected light. A second set of cone surfaces formed in a second transparent film have the same angle as the first set of cone surfaces. The first transparent film is separated from the second transparent film by a single or multilayer thin film that acts as a bandpass filter that passes most of the visible light but reflects near-infrared light. The reflective structure causes light that reflects off the bandpass layer to be directed towards the edges of the glass via total internal reflection (TIR) where the light can be converted to electricity by photovoltaic cells, or into thermal heat using a heat absorbing material. Therefore, the EGT structure acts as an optical waveguide in which the incident light that is reflected off of the reflective structure cones is guided to the periphery of the glass of the EGT structure.

In another aspect, the EGT structure again comprises a reflective structure with multiple cone surfaces formed in transparent film layers positioned under a glass substrate. A first set of cone surfaces formed in a first transparent film have a first angle to define the direction of reflected light. A second set of cone surfaces formed in a second transparent film have the same angle as the first set of cone surfaces. The first transparent film is separated from the second transparent film by a film with a low index of refraction that angularly filters light by reflecting light with large angles of incident, due to TIR. Thus, sunlight incident to the glass at large angles is scattered to the edges, while observers looking through the window at small angles have their view unobstructed. In other words, the EGT structure acts as an optical waveguide in which the reflected incident light is guided to the glass periphery, and collected as energy. In addition to cone structures, other structural shapes can also be used, such as ridged surface, prism, and hemispheric shapes. Also, the structural sizes and angles can also vary within a film.

Accordingly, a method is provided for generating energy from light incident to an EGT structure. The EGT structure is made up of a window pane with an interior surface adjacent a reflective structure. The method accepts light incident to an exterior surface of the window pane, and transmits light in the visible spectrum through the window pane and reflective structure. However, light in the near-infrared (NIR) spectrum. is reflected back from the reflective structure into the window pane, so that reflected NIR, spectrum light is supplied to an edge of the window pane. For example, reflected NIR spectrum light is supplied to the window pane edge if the light has an angle greater than or equal to the angle of TIR occurring between the window pane exterior surface and air. This reflected NIR spectrum light can be converted to electrical or thermal energy.

Another aspect of the method uses a different type of reflective structure. In this aspect, light is transmitted through the window pane and reflective structure if it is incident to the window pane exterior surface at an angle less than or equal to a first angle, where the first angle is measured with respect to a direction perpendicular the window pane exterior surface. However, light is reflected back from the reflective structure into the window pane, if the light is incident to the window pane exterior surface at an angle greater than the first angle. Then, the method supplies the reflected light to an edge of the window pane.

More explicitly, light is reflected back from the reflective structure into the window pane in response to TIR occurring within the reflective structure. Likewise, the reflected light is supplied to the edge of the window pane in response to reflected light having an angle greater than or equal to an angle of TIR occurring between the window pane exterior surface and air.

Additional details of the above-described method and EGT structures are described in greater detail below.

DETAILED DESCRIPTION

Figure 1:
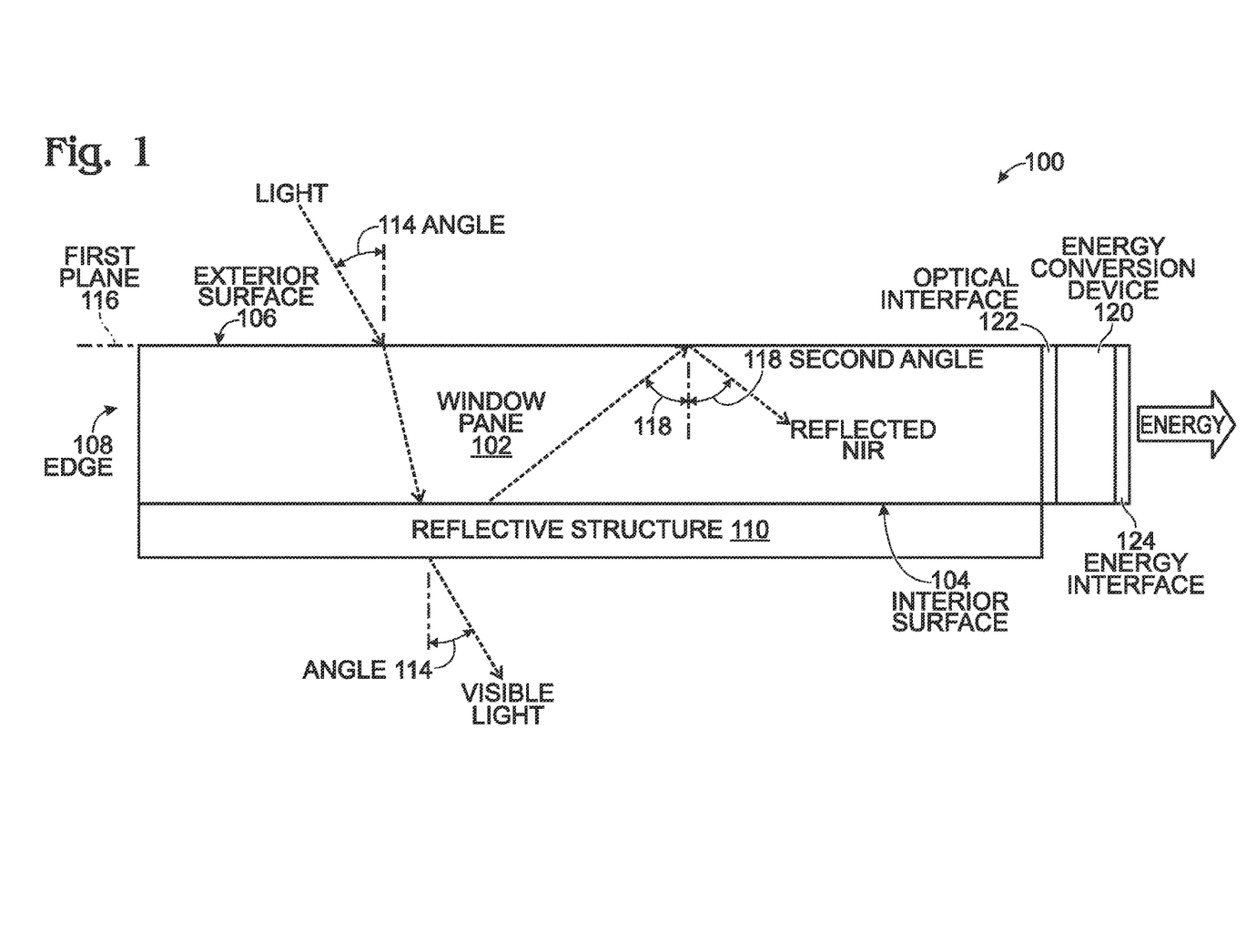
FIG. 1 is a partial cross-sectional view of an energy-generating transparent (EGT) structure.

FIG. 1 is a partial cross-sectional view of an energy-generating transparent (EGT) structure. The EGT structure 100 comprises a window pane 102, with an interior surface 104, an exterior surface 106, and an edge 108. The window pane is transparent to visible and near-infrared (NIR) wavelengths of light incident to the exterior surface 106. The window pane 102 may be made of conventional materials, such as glass, silica, or plastics, and is not limited to any particular type of material. As used herein, "transparent" is understood. to be the transmission of greater than 80% of light at a specified wavelength, although the EGT structure 100 is not necessarily limited to any particular percentage of transmission. As used herein, the visible wavelengths of light are approximately in the range of 400 to 700 nanometers (nm), although the definition of the high and low wavelength values may vary depending upon individual perception and the degree of visibility. As used herein, NIR refers to wavelengths in the range from approximately 700 nm to 3 microns.

A reflective structure 110 is adjacent to the window pane interior surface 104. The reflective structure 110 is transparent to visible wavelengths of light and reflects NIR wavelengths of light. The window pane 102 internally guides NIR wavelengths of light, reflected back from the reflective structure 110, towards the window pane edge 108. Although it can be stated that the window pane acts as an optical waveguide for the reflected NIR wavelengths of light, it should be understood that not necessarily all of the reflected NIR wavelengths of light are internally guided, between the window pane interior surface 104 and exterior surface 106, through the window pane 102 to the edge 108. As used herein, "reflective" is understood to be the reflection of greater than 50% of light at a specified wavelength, although the EGT structure 100 is not necessary limited to any particular percentage of reflection.

Figure 2:
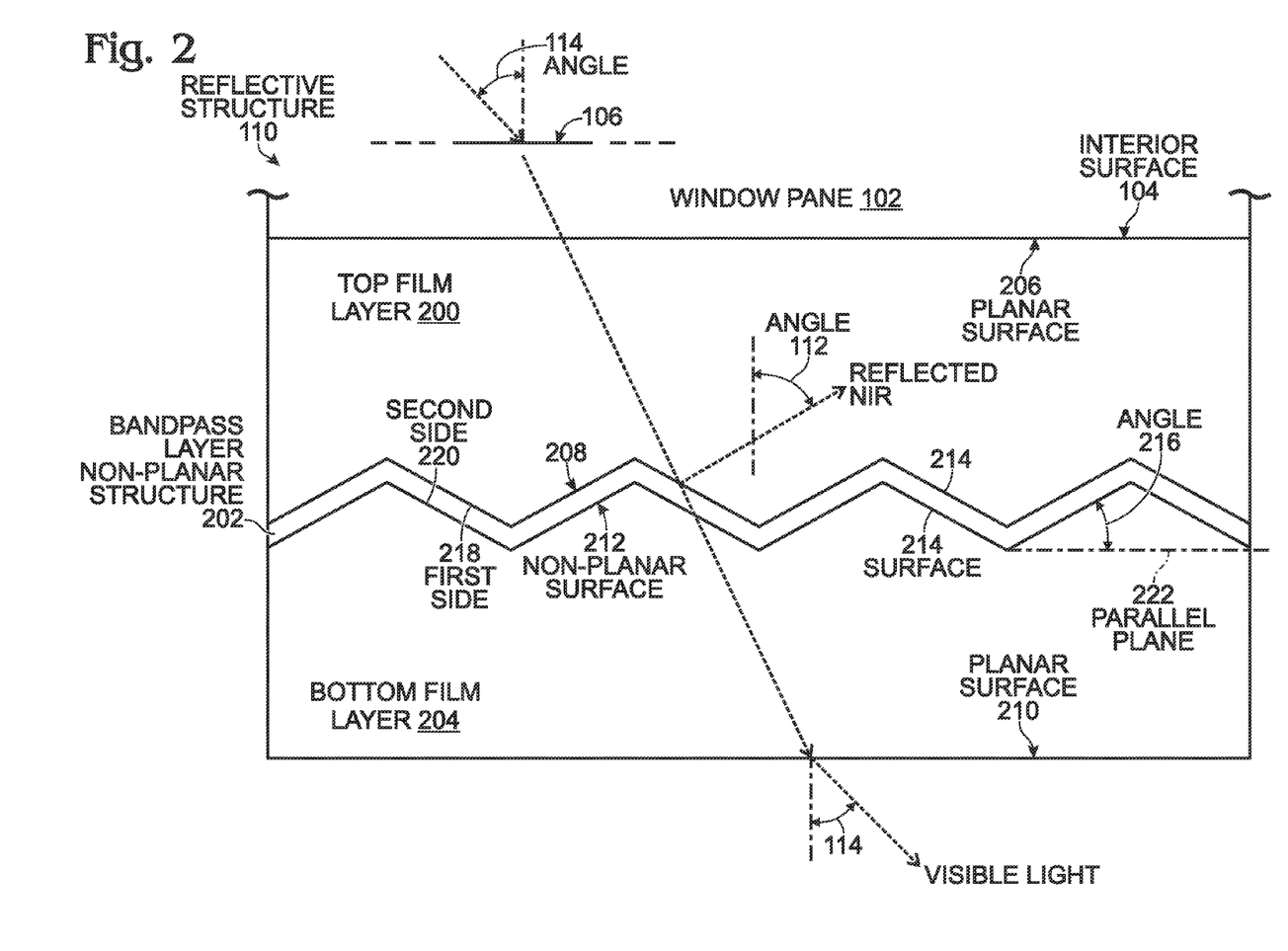
FIG. 2 is a partial cross-sectional view of the reflective structure of FIG. 1 in greater detail.

FIG. 2 is a partial cross-sectional view of the reflective structure of FIG. 1 in greater detail. The reflective structure 110 comprises a top film layer 200, underlying the window pane interior surface 104, transparent to visible and NIR wavelengths of light. A bandpass layer non-planar structure 202, underlying the top film layer 200, is transparent to visible wavelengths of light and reflective to NIR wavelengths of light. A bottom film layer 204, underlying the bandpass layer non-planar structure 202, is transparent to visible and NIR wavelengths of light. Explicit examples of selective light wavelength reflective and absorbing materials have been presented in the parent application entitled, ENERGY-EFFICIENT TRANSPARENT SOLAR FILM, invented by Aki Hashimura et al., Ser. No. 13/872,473, filed on Apr. 29, 2013, which is incorporated herein by reference. However, the bandpass layer non-planar structure is not necessarily limited to just these materials, as other (unnamed) materials may also be used.

The top film layer 200 has a planar surface 206 adjacent to the window pane interior surface 104 and a non-planar surface 208 conforming to the bandpass layer non-planar structure 202. The bottom film layer 204 has a planar surface 210 and a non-planar surface 212 conforming to the bandpass layer non-planar structure 202. Returning briefly to FIG. 1, it can be seen that the window pane exterior surface 106 is formed in a first plane 116, and a parallel plane 222 is shown in FIG. 2. The bandpass layer non-planar structure 202 comprises a plurality of surfaces 214. Each surface 214 is formed at a non-zero degree angle 216 with respect to the parallel plane 222. In a plan view (not shown) the surfaces of the bandpass layer non-planar structure may be seen as a series of parallel waves or ridges. Alternatively, the surfaces may be shaped as cones (see FIG. 6), pyramids, or multi-sided pyramid-like structures. Further, although the angles 216 are shown as uniform, alternatively, the angles of the surfaces across the bandpass layer non-planar structure may vary. In addition, although the surfaces are all shown as locally planar, they may alternatively be, uniformly or non-uniformly, convex or concave shaped. In one aspect, NIR wavelength light is reflected at an angle 112 that is modified with respect to an angle, 114 of window pane exterior surface incidence, as measured with respect to a direction (shown with dotted lines) perpendicular (normal) to the first planes 116 or parallel plane 222. The angle modification is due to the non-zero angles 216 of the bandpass layer non-planar structure surfaces 214.

The bandpass layer non-planar structure 202 comprises a first side 218 adjacent the top film layer 200, having a first shape. The first shape is defined by the shapes and angles of the surfaces 214. The bandpass layer non-planar structure 202 has a second side 220 adjacent the bottom film layer 204. In one aspect, the second side 220 has the first shape. Further, if both the top film layer 200 and bottom film layer 204 have (the same) first index of refraction, then visible wavelength light transmitted through the EGT structure has that same angle 114 as the angle of window pane exterior surface incidence 114, and the view through the window is clear and undistorted. In some aspects, the bandpass layer non-planar structure is also absorbent of particular wavelength bands.

Returning to FIG. 1, the window pane 102 has a second index of refraction and a total internal reflection (TIR) at angles of NIR wavelength light greater than or equal to a second angle 118. The TIR is responsive to the second index of refraction and an index of refraction of one, assuming the window pane exterior surface 106 is adjacent an air medium. Otherwise, the TIR would be response to the second index of refraction and the index of refraction of the medium adjacent to the window pane exterior surface 106. In this manner, the window pane 102 guides NIR wavelength light reflected from the bandpass layer non-planar structure (202, see FIG. 2), incident to the window pane waveguide exterior surface 106 at angles greater than or equal to the second angle 118, via internal reflection to the window pane edge 108.

In one aspect, as shown, the EGT structure 100 further comprises an energy conversion device 120 having an optical interface 122 to accept NIR wavelength light reflected by the reflective structure 110, and an energy interface 124 to supply an energy form generated in response to the NIR wavelength light. For example, the energy conversion device 120 may be a photovoltaic (PV) device that supplies electrical current, or a NIR wavelength light absorber that supplies thermal energy. As used herein, "absorption" refers to light that is not scattered or transmitted. It is absorbed by a material and turned into other forms of energy, typically heat. The EGT structure 100 is not limited to any particular type or placement of the energy conversion device(s). As shown, the energy conversion device optical interface 122 is adjacent the window pane edge 108, and perpendicular to the first plane 116, to accept NIR, wavelength light guided through the window pane 102. Other arrangements of the energy conversion device are presented below.

Figure 3:
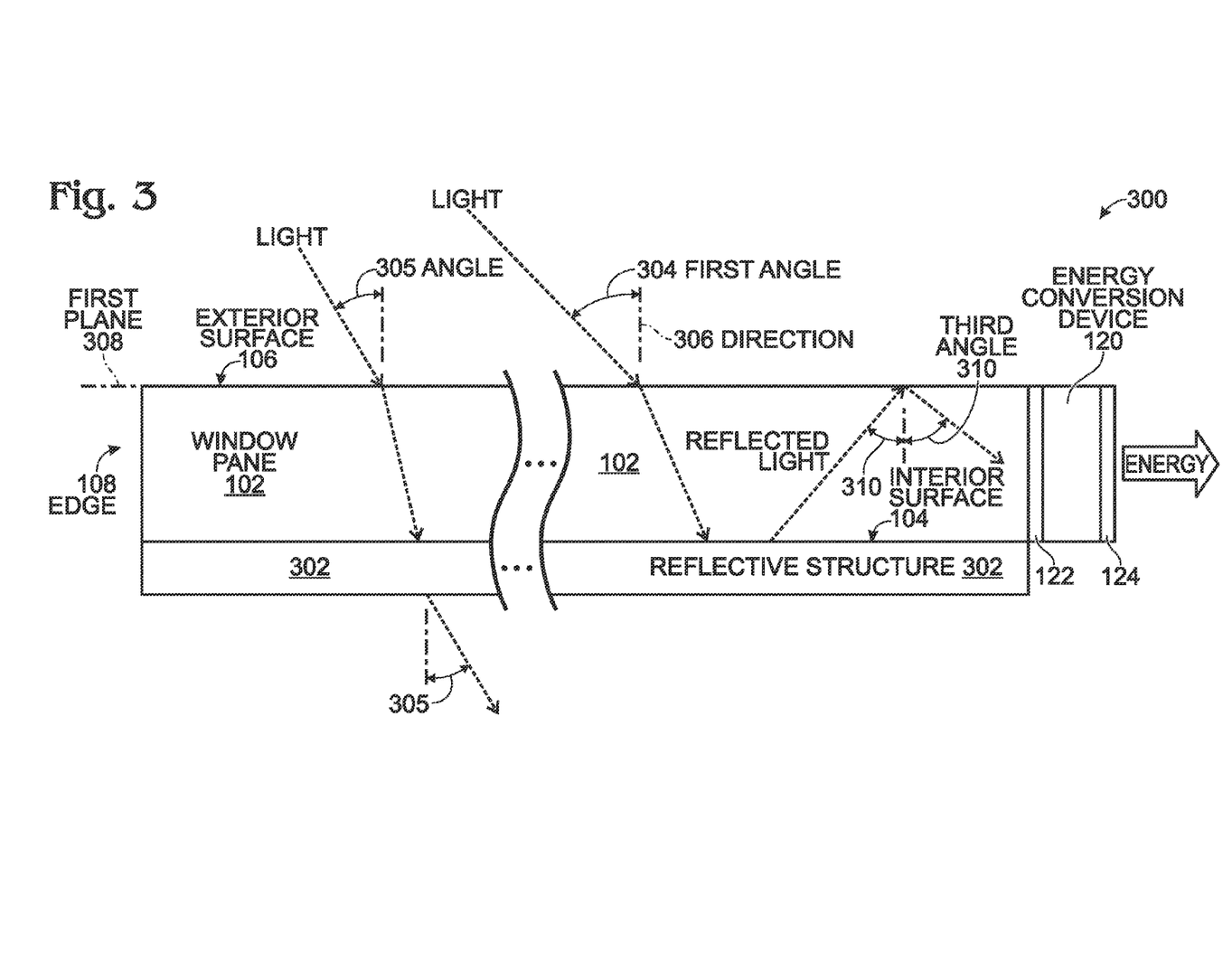
FIG. 3 is a partial cross-sectional view of a first variation of the EGT structure.

FIG. 3 is a partial cross-sectional view of a first variation of the EGT structure. In this aspect, the EGT structure 300 comprises a window pane 102, with an interior surface 104, an exterior surface 106, and an edge 108. The window pane 102 is transparent to light incident to the exterior surface 106. A reflective structure 302 is adjacent to the window pane interior surface 104. The reflective structure 302 is transparent to light incident to the window pane exterior surface 106 at angles less than a first angle 304 (e.g., angle 305), and reflective to light incident to the window pane exterior surface 106 at angles greater than or equal to the first angle. The first angle 304 is measured with respect to a direction 306 perpendicular (normal) to the window pane exterior surface 106. The window pane 102 internally guides light, reflected back from the reflective structure 302, to the window pane edge 108. Note, in this aspect, the reflective structure 302 need not necessary be selectively reflective to particular wavelength bands.

Figure 4:
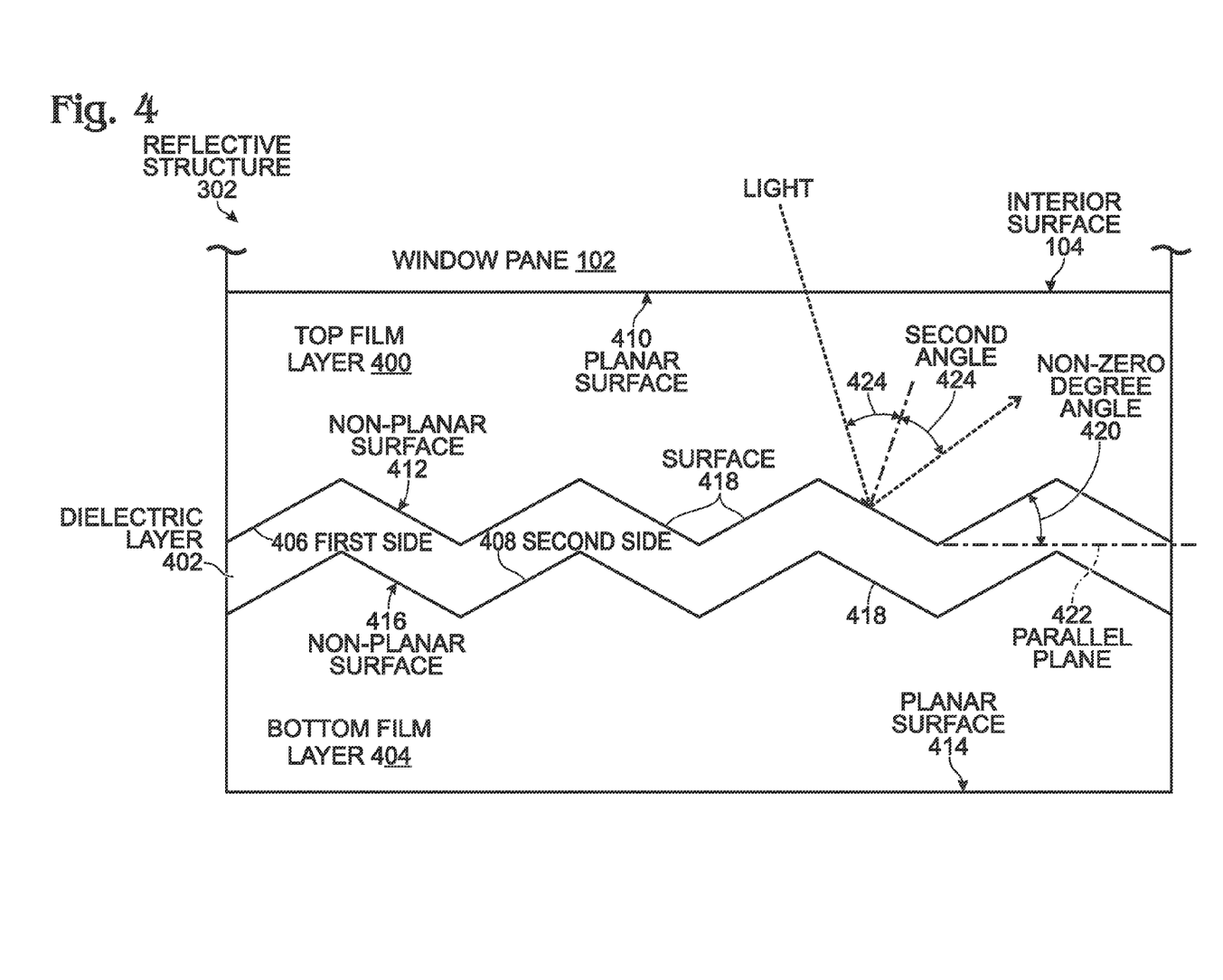
FIG. 4 is a partial cross-sectional diagram of the reflective structure of FIG. 3 in greater detail.

FIG. 4 is a partial cross-sectional diagram of the reflective structure of FIG. 3 in greater detail. In this aspect of the EGT structure 300, the reflective structure 302 comprises a top film layer 400, underlying the window pane interior surface 104. The top film layer 400 is transparent to light and has a first index of refraction. A dielectric layer 402, underlying the top film layer 400, is transparent to light and has a second index of refraction, less than the first index of refraction. A bottom film layer 404, underlying the dielectric layer, is transparent to light and has the first index of refraction as the top film layer 400.

In one aspect, the dielectric layer 402 has a non-planar first side 406, formed with a first shape, adjacent to the top film layer 400, and a non-planar second side 408 with the first shape, adjacent to the bottom film layer 404. The top film layer 400 has a planar surface 410 adjacent to the window pane interior surface 104 and a non-planar surface 412 with the first shape, adjacent to the dielectric layer first side 406. The bottom film layer 404 has a planar surface 414 and a non-planar surface 416 with the first shape, adjacent to the dielectric layer second side 408. Since both the top film layer 400 and bottom film layer 404 have (the same) first index of refraction, and the dielectric layer first side 406 and second side 408 have the same shape, light transmitted through the EGT structure (e.g., angle 305, see FIG. 3) has that same angle as the angle of window pane exterior surface incidence. As long as the angle of window pane exterior surface incidence is less than the first angle (304, see FIG. 3), the view through the window is clear and undistorted. In some aspect, the dielectric layer 402 is selective reflective or absorbent of particular wavelength bands.

Returning briefly to FIG. 3, the window pane exterior surface 106 is formed in a first plane 308, and a parallel plane 422 is shown in FIG. 4. The dielectric layer first side 406 and second side 408 each comprises a plurality of surfaces 418. Each surface 418 is formed at a non-zero degree angle 420 with respect to the parallel plane 422. In a plan view (not shown) the surfaces of the 418 may be enabled as a series of parallel waves or ridges. Alternatively, the surfaces may be shaped as cones, pyramids, or multi-sided pyramid-like structures. Further, although the angles 420 are shown as uniform, alternatively, the angles of the surfaces 418 across the dielectric layer first and second sides may vary. In addition, although the surfaces 418 are all shown as locally planar, they may alternatively be, uniformly or non-uniformly, convex or concave shaped. The top film layer non-planar surface 412 has a TIR at the second angle 424, measured with respect to the normal (perpendicular) to the non-planar surface 412, and responsive to the first index of refraction and the second index of refraction.

Returning to FIG. 3, the window pane 102 has a third index of refraction and a TIR at angles greater than or equal to a third angle 310, measured with respect to the normal to the window pane exterior surface 106. The window pane TIR is responsive to the third index of refraction and an index of refraction of one, assuming the window pane exterior surface 106 is adjacent an air medium. Otherwise, the TIR would be response to the second index of refraction and the index of refraction of the medium adjacent to the window pane exterior surface 106. In this manner, the window pane 102 guides NIR wavelength light reflected from the top film layer non-planar surface (412, see FIG. 4), incident to the window pane waveguide exterior surface 106 at angles greater than or equal to the third angle 310, via internal reflection to the window pane edge 108.

In one aspect, as shown, the EGT structure 300 further comprises an energy conversion device 120 having an optical interface 122 to accept light reflected by the reflective structure 302, and an energy interface 124 to supply an energy form generated in response to the accepted light. For example, the energy conversion device 120 may be a photovoltaic (PV) device that supplies electrical current or a light absorber that supplies thermal energy. The EGT structure 300 is not limited to any particular type or placement of the energy conversion device(s). As shown, the energy conversion device optical interface 122 is adjacent the window pane edge 108, and perpendicular to the first plane 308, to accept light guided through the window pane 102. Other arrangements of the energy conversion device are presented below.

Figure 5:
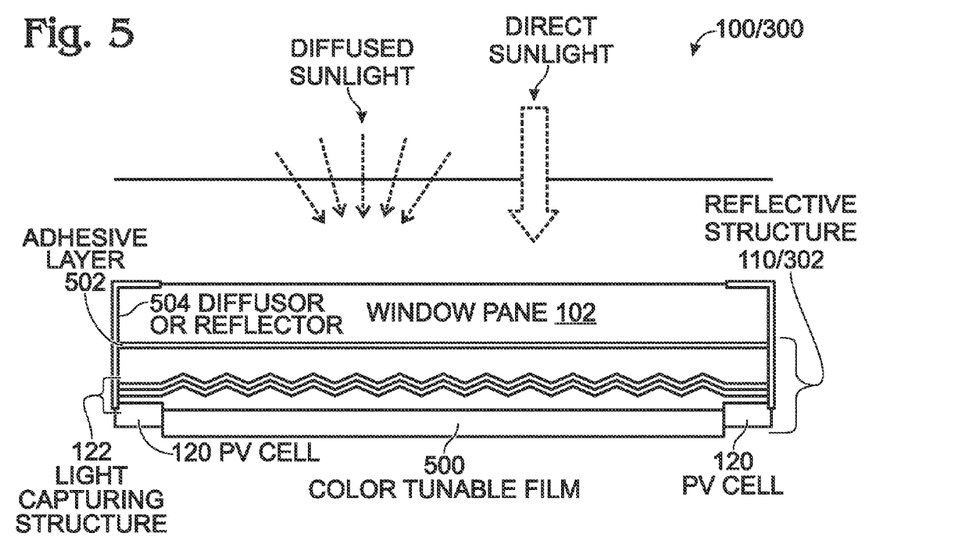
FIG. 5 is a partial cross-sectional view of a second variation of the EGT structure.

FIG. 5 is a partial cross-sectional view of a second variation of the EGT structure. The EGT structure can be used as a power source for different applications such as smart windows and portable electronic devices. The self-powering smart window or EGT structure comprises three main parts. The first part is the window glass 102 that faces exterior where the sunlight is incident. The sunlight can be either direct or diffused light depending on the weather conditions. The second part is the reflective structure, either 110 or 302, that is attached to the interior surface of the glass (e.g., via adhesive layer 502). The reflective structure may comprise optically transparent films, such as poly(methyl methacrylate (PMMA), polycarbonate, olefin co-polymer, polyethylene naphthalate, silicone, or any other transparent materials, with embedded. structures that reflect incident light back into the transparent film and glass. The reflected light which is guided to the sides of the film and glass is captured by light capturing structure or optical interface 122, and converted into electricity by strips of PV cells 120 that are attached to the back edges of the glass, as shown. Here, the optical interface 122 is formed on the edge of the reflective structure 110/302, and not on the edge of the window pane 102. Alternatively, the PV cells 120 can also be attached to the side peripherals of the glass and transparent film (not shown). In one example, the reflective structure can be an array of cone structures that is optimally designed to reduce the haze generated from scattering of the visible light. Further, the self-powering window may comprise a color tunable film 500 that is attached to the EGT structure. The color tunable film 500 can be any film that can dynamically alter visible color by applying power to the film. For example, the color tunable film 500 can be an electrochromic layer using power generated from the PV cells 120. The color tunable layer 500 can also change the transmission of IR. solar heat so that the smart window can act as both window shading and an energy efficient window. In general, the color tunable film may be made from many existing device technologies, such as electrochromic, polymer dispersed liquid crystal, or suspended particle devices. Diffusors or reflectors 504 may act to redirect or reflect light towards the optical interfaces.

Figure 6:
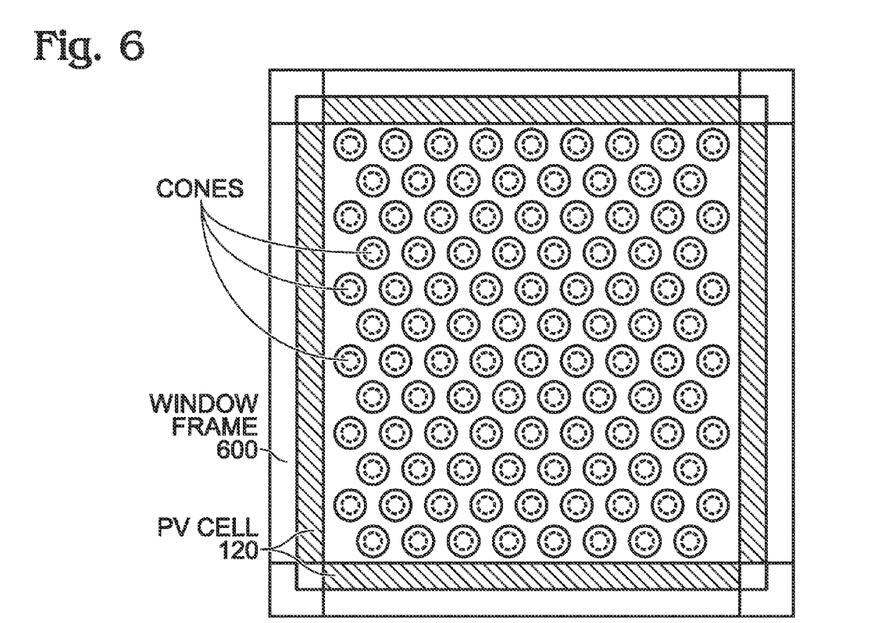
FIG. 6 is a plan view of an exemplary EGT structure comprising window glass and a reflective structure attached to the interior side of the window glass.

FIG. 6 is a plan view of an exemplary EGT structure comprising window glass and a reflective structure attached to the interior side of the window glass. The PV cell 120 is hidden behind the window frames 600, so it is not visible from the outside view. In this example the surfaces of either the bandpass layer non-planar structure sides (FIG. 2) or the dielectric layer sides (FIG. 4) are formed as cones in an integrated array. Other shapes and arrays are possible where the structure size, angles, and/or spacings can vary across the window pane length and width.

In general, when light is incident on an interface between two dielectric media, a portion reflects back into the first medium, and the remainder transmits into the second medium. The percent of light that reflects and transmits, as well as the angles of the reflected and transmitted light, depend on the angle of incidence with respect to the normal of the interface, and the refractive indices of the two media. The angle of the reflected light, $\theta_r$, with respect to the surface normal is always equal to the angle of the incident light, $\theta_i$.

$$\theta_i = \theta_r \quad (1)$$

The angle of the transmitted light, $\theta_t$, with respect to the surface normal is given by Snell's law $$n_i \sin(\theta_i) = n_t \sin(\theta_t) \quad (2)$$

where $n_i$ and $n_t$ are the refractive indices of the incident and transmission media, respectively. For small angles of incidence, the magnitude of the transmitted light is generally much larger than the reflected light. When light is propagating from a high index to low index medium there exists an angle, referred to as the critical angle, such that all light incident at larger angles will undergo total internal reflection (TIR). The critical angle, $\theta_c$, can be derived from (2) by setting $\theta_t$ equal to 90°.

$$\theta_c = \arcsin\left(\frac{n_t}{n_i}\right) \quad (3)$$

Multilayer thin films utilize optically thin alternating layers of metals and dielectrics to control the angular and specular reflectance and transmittance of surfaces. These thin films can be used in the reflective structure as either the bandpass layer non-planar structure of FIG. 2 or the dielectric layer of FIG. 4.

Figure 7:
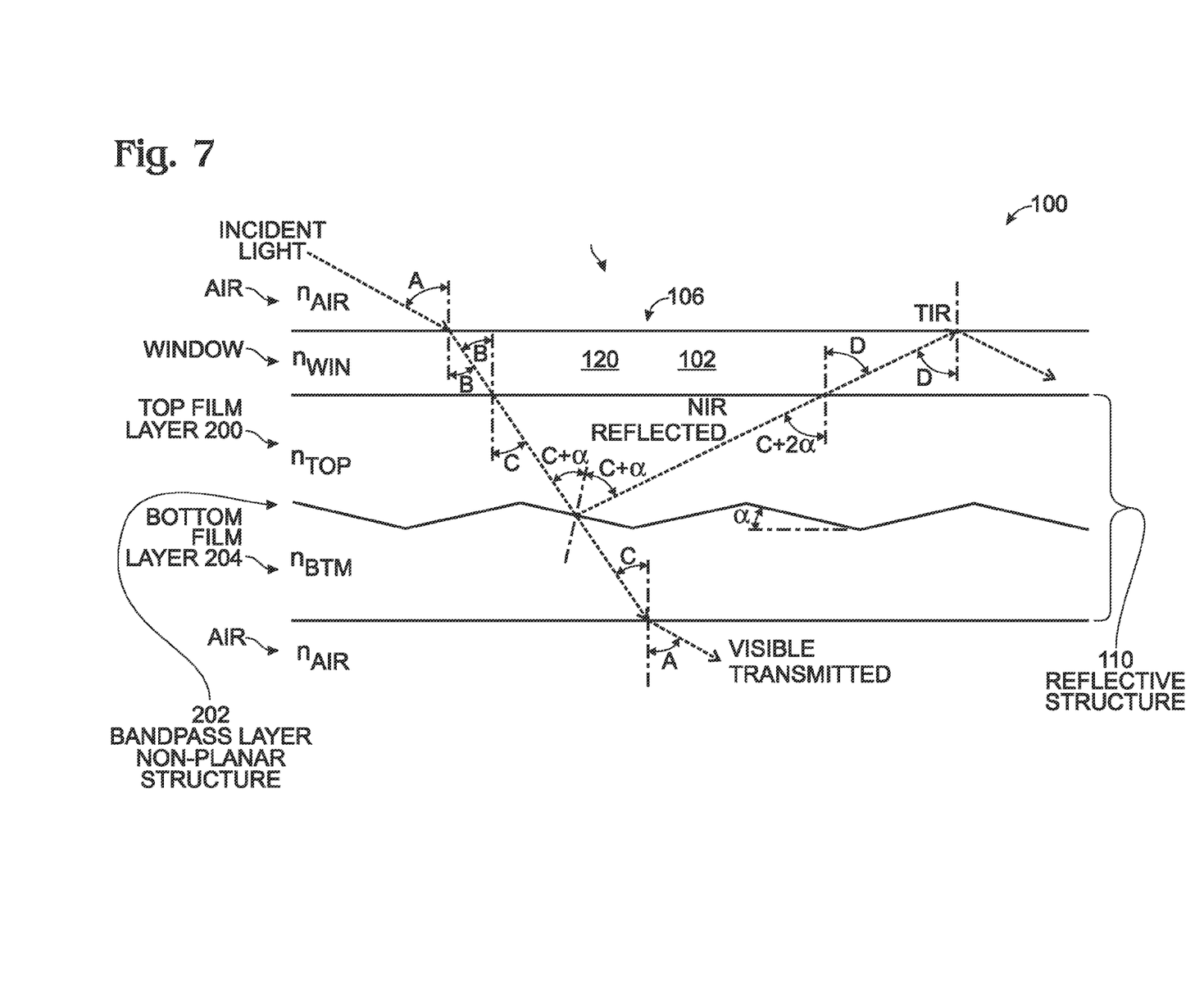
FIG. 7 is a partial cross-sectional diagram depicting the EGT structure of FIGS. 1 and 2.

FIG. 7 is a partial cross-sectional diagram depicting the EGT structure of FIGS. 1 and 2. The EGT structure 100 may utilize a single or multilayer thin film that is designed to act as the bandpass layer non-planar structure: transmitting visible light and reflecting near-infrared light. The thin film is structured and embedded between two transparent dielectric media (200 and 204) of the same or similar refractive indices. The structure of the thin film causes light that reflects off of it to be directed towards the edges of the window pane 102 where the light can be converted to electricity by photovoltaic cells, for example. Light incident on the window at angle A refracts into the window with refractive index $n_{win}$ at angle B given by (2). The ray then propagates and refracts into the top section of the film with refractive index $n_{top}$ at angle C also given by (2).

$$n_{air}\sin(A)=n_{win}\sin(B)=n_{top}\sin(C) \quad (4)$$

The light then strikes the textured thin film (bandpass layer non-planar structure) 202 where visible light is primarily transmitted and near infrared light is primarily reflected. For a texture at angle α, the reflected light is incident on the reflective structure-window pane interface at angle C+2α, and at the window-air interface at angle D, which is related to C+2α by (2).

$$n_{top}\sin(C+2\alpha)=n_{win}\sin(D) \quad (5)$$

If D is greater than the critical angle for the window pane-air interface, as determined by (3), then all the light is reflected back into the window pane where it continues to propagate towards the edges. The texture of the thin film 202 is designed to maximize the amount of near-infrared light that reaches the edges of the window pane.

Visible light incident on the textured thin film 202 transmits through it. To ensure that the transmitted light does not bend as it passes from the top film layer 200 to the bottom film layer 204, the refractive indices of the top and bottom film layers may be identical. Any difference in the refractive indices causes the light to bend according to (2), and causes scenes viewed through the window to appear distorted and blurry. If the refractive indices are nearly identical, then visible light incident on the window at angle A will pass through the window glass 102 and reflective structure 110 and emerge at angle A, as though the reflective structure was not present.

Figure 8:
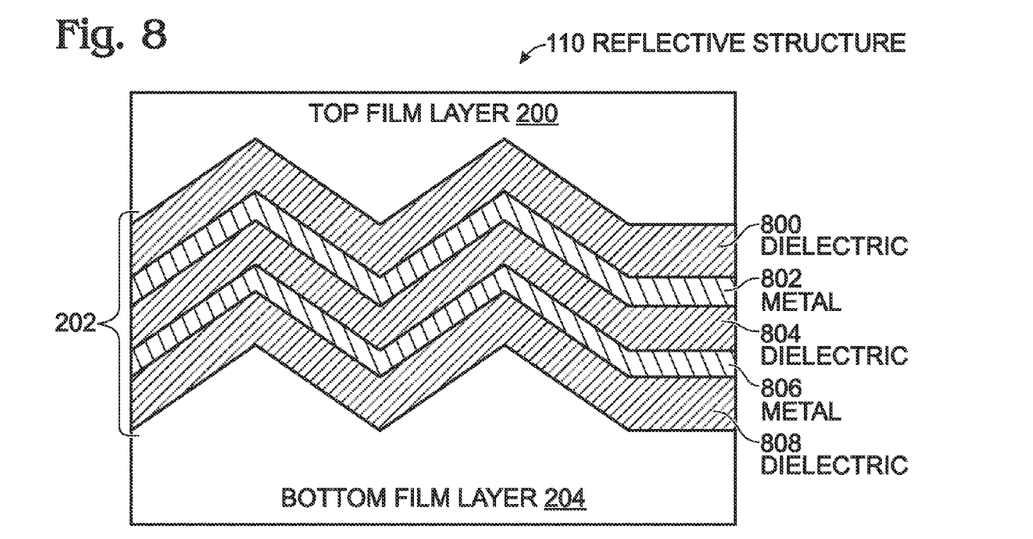
FIG. 8 is a partial cross-sectional view of an exemplary bandpass layer non-planar structure.

FIG. 8 is a partial cross-sectional view of an exemplary bandpass layer non-planar structure. The texture of the embedded layer is a hexagonal array of cones with side angles of 35°. The diameter and pitch of the cones is 1 millimeter (mm), although this dimension has no impact on the collection efficiency and may be increased or decreased. The multilayer thin-film coatings comprising dielectric films 800, 804, and 808, as well as metal films 802 and 806, are formed as a textured structure and act as a bandpass filter; passing visible light and reflecting near-infrared light. The multilayer thin-film stack 800-808 may be a stack of dielectric and metal layers, such as silicon oxide and silver thin films. For example, the thickness of each film can be in the range of 100 to 300 nanometers (nm) for silicon oxide layer, and 3 to 10 nm for silver layer. Also, there may be more or fewer dielectric and metal films, and there may be more than one type of dielectric and one type of metal. It should be understood that none of the drawings presented herein are drawn to scale, and typically the window pane is much thicker than the reflective structures.

Figure 9A:
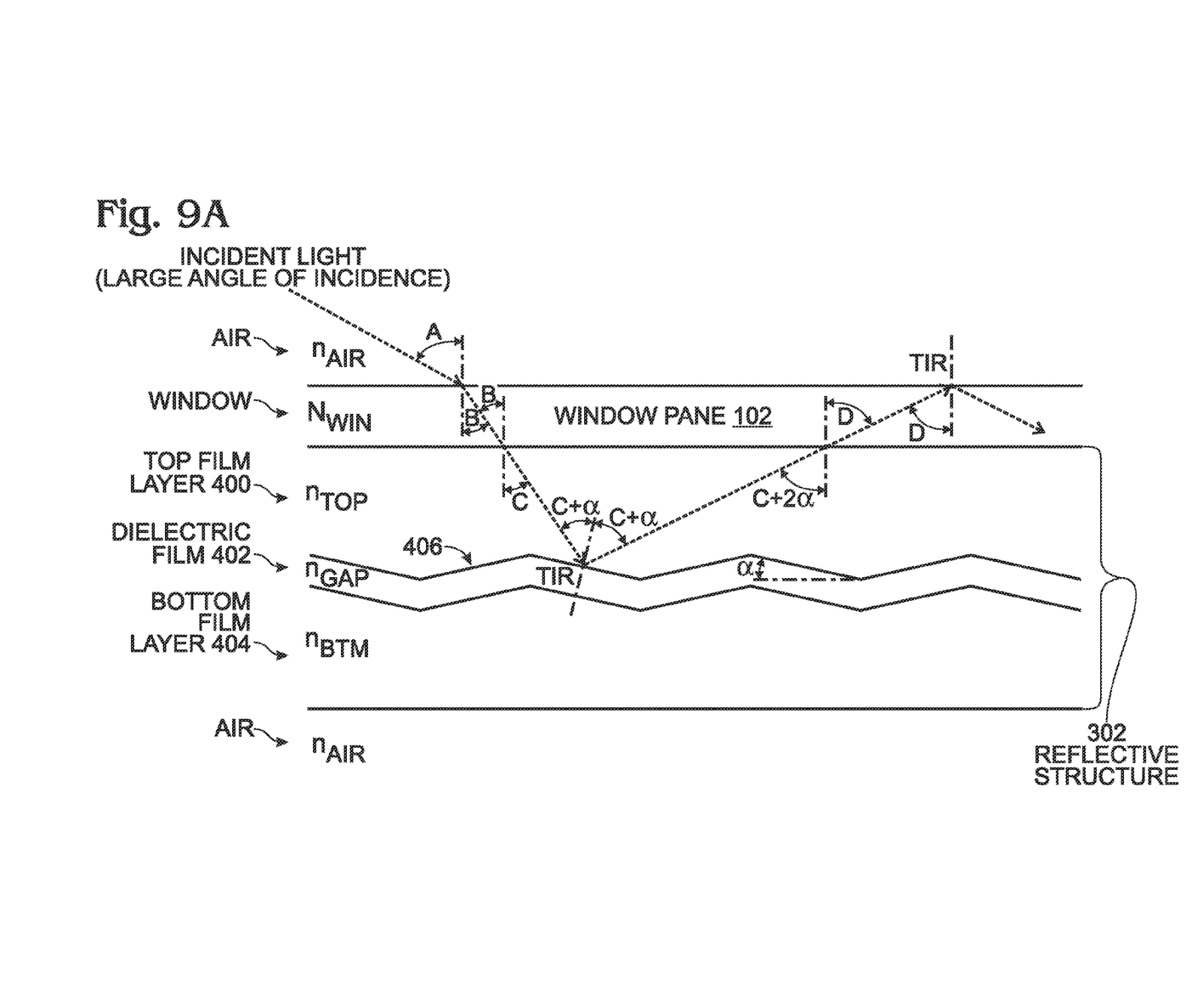
FIGS. 9A and 9B are partial cross-sectional views of the EGT structure of FIGS. 3 and 4.
Figure 9B:
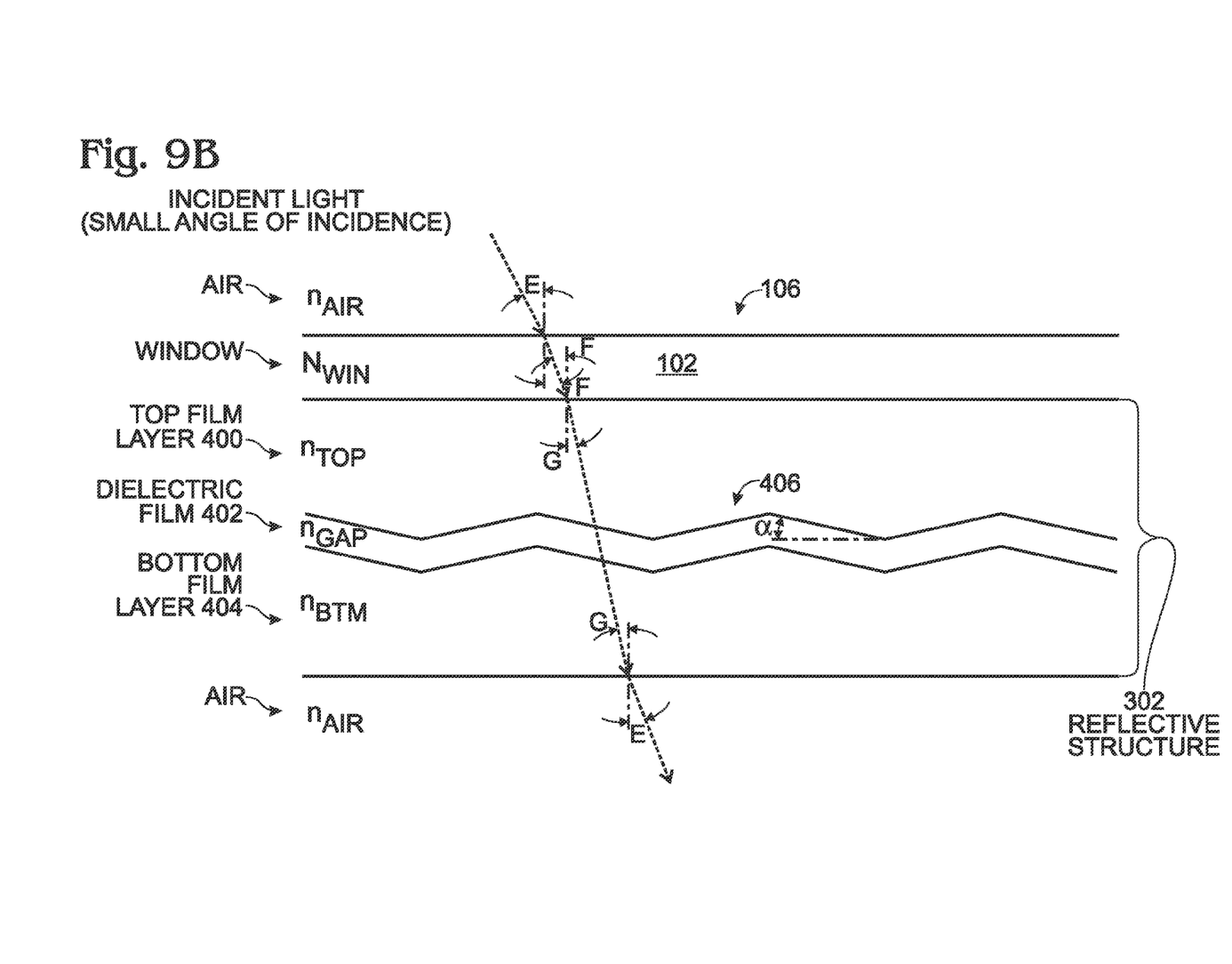

FIGS. 9A and 9B are partial cross-sectional views of the EGT structure of FIGS. 3 and 4. In this aspect the reflective structure 302 utilizes a low index dielectric film 402 as gap between the top and bottom film layers 400 and 404, instead of a multilayer thin film, to angularly filter light passing through the EGT structure via total internal reflection. The benefit of this approach is that sunlight incident on the window at large angles is scattered to the edges, while observers looking through the window at small angles have their view unobstructed. The refractive index of the gap (dielectric) layer 402 is lower than the top and bottom film layers 400 and 404, so light incident on the gap layer 402 at an angle above the critical angle for this interface has TIR (FIG. 9A). Light incident on the gap layer 402 at an angle below the critical angle transmits through it (FIG. 9B). Again it should be noted that none of the drawings presented herein are drawn to scale and that the window pane is generally much thicker than the reflective structures.

In FIG. 9A, light is incident on the window pane at a large angle, A. The ray refracts into the window pane at angle B=a sin [$(n_{air}/n_{win})\cdot\sin(A)$], and again into the top film layer 400 at angle C=a sin [$(n_{win}/n_{top})\cdot\sin(B)$]. The ray is incident on the gap layer 402 at angle C+α with respect to the normal to the gap film first side 406, where α is the texture angle. C+α is greater than the critical angle for this interface, so the ray reflects off of the interface due to TIR, and is incident on the top film layer-window pane interface at angle C+2α. The ray transmits into the window pane 102 at angle D=a sin [$(n_{top}/n_{win})\cdot\sin(C+2\alpha)$]. Finally, the ray strikes the window pane-air interface at angle D and, if D is greater than the critical angle for this interface, reflects back into the window pane due to TIR, where it continues to propagate toward energy conversion cells at the edges of the window pane.

In FIG. 9B, light is incident on the window pane 102 at a small angle, E. The ray refracts into the window pane at angle F=a sin [$(n_{air}/n_{win})\cdot\sin(E)$], and again into the top film layer 400 at angle G=a sin [$(n_{win}/n_{top})\cdot\sin(F)$]. The ray is incident on the gap layer 402 at an angle below the critical angle for this interface, so the ray transmits into the gap layer. The first side 406 and second side 408 of the gap layer 402 are approximately parallel, and the top and bottom film layers 400 and 404 have approximately the same index of refraction, so the ray exits the gap layer 402 into the bottom film layer 404 at angle G. The ray then exits the EGT structure at angle E=a sin [$(n_{bot}/n_{air})\cdot\sin(G)$]. The incident and exiting angles are equal, so the window and EGT film appear transparent.

The gap layer 402 is typically made thick enough (much larger than visible wavelengths) to avoid interference colors and to ensure that TIR occurs, but thin enough to reduce ray deviation. As light rays pass into and out of the gap layer 402 they bend according to (2). If the top film layer 400-bottom film layer 404 interfaces 406/412 and 408/416 are parallel where a given ray intersects them, then the ray will be undeviated after passing through the EGT structure. If, however, the gap interfaces are not parallel where a ray intersects them, then the ray will have a net deviation after passing through the window pane and reflective structure, causing blurring of scenes viewed through the window. This deviation can be reduced by minimizing the thickness of the low index gap layer 402.

This aspect of the EGT structure relies on TIR, which is spectrally independent over the visible (Vis)-NIR range where the material indices do not significantly vary with wavelength. In addition, bandpass films, such as described in the reflective structure of FIGS. 1 and 2, may be added to the surfaces of the gap layer 402 to reduce or enhance the reflectance of visible and near-infrared light, respectively.

Figure 10:
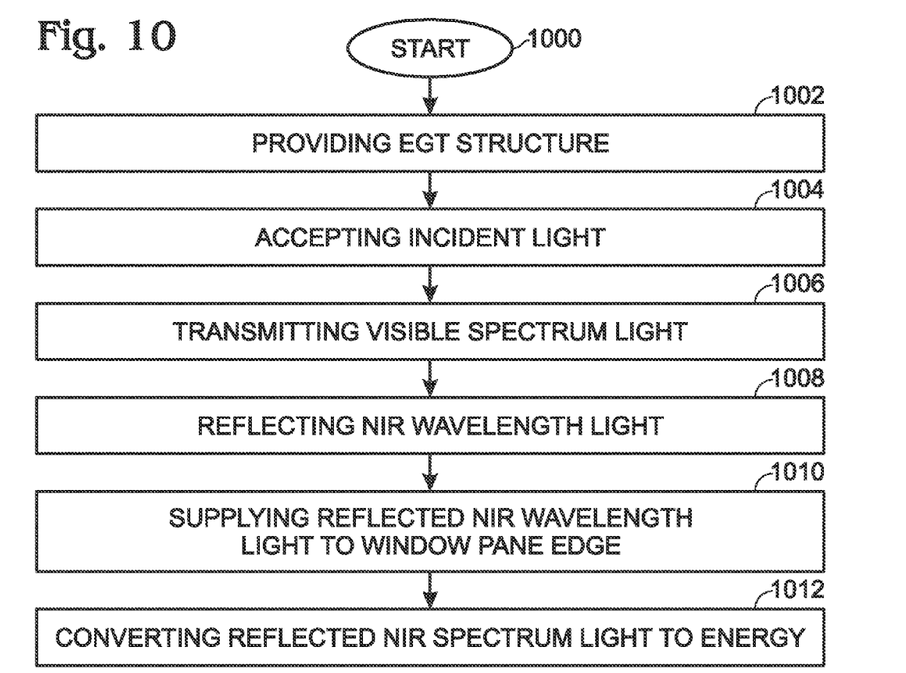
FIG. 10 is a flowchart illustrating a method for generating energy from light incident to an EGT structure.

FIG. 10 is a flowchart illustrating a method for generating energy from light incident to an EGT structure. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 1000.

Step 1002 provides an EGT structure having a window pane with an interior surface adjacent a reflective structure. The EGT structure has been described above in the explanations of FIGS. 1 and 2. Step 1004 accepts light incident to an exterior surface of the window pane. Step 1006 transmits light in the visible spectrum through the window pane and reflective structure. Step 1008 reflects light in the near-infrared (NIR) spectrum back from the reflective structure into the window pane. Step 1010 supplies reflected NIR spectrum light to an edge of the window pane. Step 1012 converts the reflected NIR spectrum light into an energy form supplied to the window pane edge. The energy form may be electrical current created via photovoltaics or thermal energy created via NIR wavelength light absorption, although other light converting forms of energy are possible, and the method is not necessarily limited to just these energy forms.

In one aspect, accepting light incident to the exterior surface of the window pane in Step 1004 includes accepting light incident to the exterior surface of the window pane at a first angle, where the angle is measured with respect to a direction perpendicular to a plane in which the window pane exterior surface is formed. Then, transmitting light in the visible spectrum through the window pane and reflective structure in Step 1006 includes transmitting light in the visible spectrum through reflective structure at the first angle.

In another aspect, supplying reflected NIR spectrum light to the edge of the window pane in Step 1010 includes supplying reflected NIR spectrum light having an angle greater than or equal to an angle of TIR, occurring between the window pane exterior surface and air.

Figure 11:
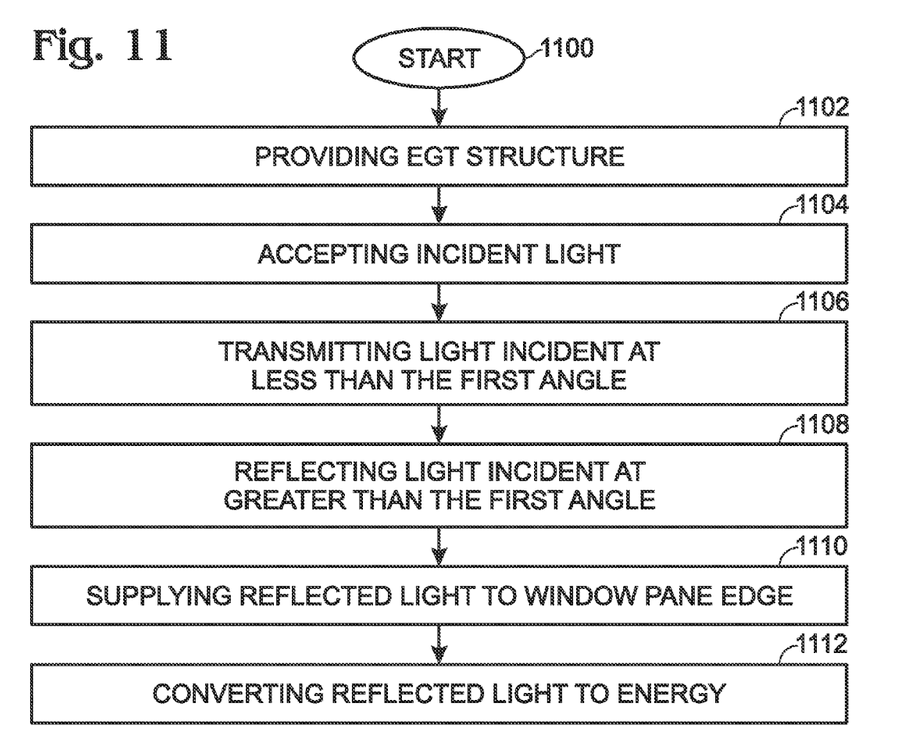
FIG. 11 is a flowchart illustrating a variation in the method for generating energy from light incident to an EGT structure.

FIG. 11 is a flowchart illustrating a variation in the method for generating energy from light incident to an EGT structure. The method begins at Step 1100. Step 1102 provides an EGT structure having a window pane with an interior surface adjacent a reflective structure. Such an EGT structure is described above in the explanation of FIGS. 3 and 4. Step 1104 accepts light incident to an exterior surface of the window pane at a plurality of angles. Step 1106 transmits light, incident to the window pane exterior surface at an angle less than or equal to a first angle, through the window pane and reflective structure. The first angle is measured with respect to a direction perpendicular (normal) to the window pane exterior surface. Step 1108 reflects light, incident to the window pane exterior surface at an angle greater than the first angle, back from the reflective structure into the window pane. Step 1110 supplies the reflected light to an edge of the window pane. Step 1112 converts the light supplied to the window pane edge into an energy form. The energy form may be electrical current created via photovoltaics or thermal energy created via light absorption, although other light converting forms of energy are possible, and the method is not necessarily limited to just these energy forms.

In one aspect, accepting light incident to the exterior surface of the window pane in Step 1104 includes accepting light incident to the exterior surface of the window pane at a second angle, less than the first angle. Then, transmitting light through the window pane and reflective structure in Step 1106 includes transmitting light through the reflective structure at the second angle.

In another aspect, reflecting light back from the reflective structure into the window pane in Step 1108 includes the light being reflected in response to TIR occurring within the reflective structure. Further, supplying the reflected light to the edge of the window pane in Step 1110 may include supplying the reflected light to the edge in response to reflected light having an angle greater than or equal to an angle of TIR occurring between the window pane exterior surface and air.

Energy-generating transparent structures and energy generation methods have been provided. Examples of particular materials, morphology, film layer order, and uses have been presented to illustrate the invention. However, the invention is not limited to merely these examples. Other variations and embodiments of the invention will occur to those skilled in the art.

We claim:

1. An energy-generating transparent (EGT) structure comprising:
   a window pane, with an interior surface, an exterior surface, and an edge, the window pane transparent to visible and near-infrared (NIR) wavelengths of light incident to the exterior surface;
   a reflective structure, adjacent to the window pane interior surface, transparent to visible wavelengths of light, and reflecting NIR wavelengths of light;
   wherein the window pane internally guides NIR wavelengths of light, reflected back from the reflective structure, towards the window pane edge;
   wherein the reflective structure comprises:
      a top film layer, underlying the window pane interior surface, transparent to visible and NIR wavelengths of light;
      a bandpass layer non-planar structure, underlying the top film layer, transparent to visible wavelengths of light and reflective to NIR wavelengths of light; and,
      a bottom film layer, underlying the bandpass layer non-planar structure, transparent to visible and NIR wavelengths of light.

2. The EGT structure of claim 1 wherein the top film layer has a planar surface adjacent to the window pane interior surface and a non-planar surface conforming to the bandpass layer non-planar structure; and,
   wherein the bottom film layer has a planar surface and a non-planar surface conforming to the bandpass layer non-planar structure.

3. The EGT structure of claim 2 wherein the window pane exterior surface is formed in a first plane; and,
   wherein the bandpass layer non-planar structure comprises a plurality of surfaces, each surface formed at a non-zero degree angle with respect to the first plane, and wherein the bandpass layer non-planar structure reflects NIR wavelength light at an angle modified with respect to the angle of window pane exterior surface incidence, as measured with respect to a direction perpendicular to the first plane.

4. The EGT structure of claim 2 wherein the bandpass layer non-planar structure comprises;
   a first side adjacent the top film layer, having a first shape; and,
   a second side adjacent the bottom film layer, having the first shape.

5. The EGT structure of claim 4 wherein the top film layer has a first index of refraction; and,
   wherein the bottom film layer has the first index of refraction.

6. The EGT structure of claim 5 wherein the window pane has a second index of refraction and a total internal reflection (TIR) at angles of NIR wavelength light greater than or equal to a second angle, the TIR responsive to the second index of refraction and an index of refraction of one; and,
   wherein the window pane guides NIR wavelength light reflected from the bandpass layer non-planar structure, incident to the window pane waveguide exterior surface at angles greater than or equal to the second angle, via internal reflection to the window pane edge.

7. The EGT structure of claim 1 further comprising:
an energy conversion device having an optical interface to accept NIR wavelength light reflected by the reflective structure, and an energy interface to supply an energy form generated in response to the NIR wavelength light, where the energy form is selected from a group consisting of electrical current via photovoltaics and thermal energy via NIR wavelength light absorption.

8. The EGT structure of claim 7 wherein the energy conversion device optical interface is adjacent the window pane edge to accept NIR wavelength light guided through the window pane.

9. An energy-generating transparent (EGT) structure comprising:
a window pane, with an interior surface, an exterior surface, and an edge, the window pane transparent to visible and near-infrared (NIR) wavelengths of light incident to the exterior surface;
a reflective structure, adjacent to the window pane interior surface, transparent to visible wavelengths of light, and reflecting NIR wavelengths of light;
wherein the window pane internally guides NIR wavelengths of light, reflected back from the reflective structure, towards the window pane edge; and,
the EGT structure further comprising:
an energy conversion device having an optical interface to accept NIR wavelength light reflected by the reflective structure, and an energy interface to supply an energy form generated in response to the NIR wavelength light, where the energy form is selected from a group consisting of electrical current via photovoltaics and thermal energy via NIR wavelength light absorption.

10. The EGT structure of claim 9 wherein the energy conversion device optical interface is adjacent the window pane edge to accept NIR wavelength light guided through the window pane.

* * * * *